(12) United States Patent
Kang et al.

(10) Patent No.: US 11,587,796 B2
(45) Date of Patent: Feb. 21, 2023

(54) 3D-NAND MEMORY CELL STRUCTURE

(71) Applicant: Applied Materials, Inc., Santa Clara, CA (US)

(72) Inventors: Chang Seok Kang, San Jose, CA (US); Tomohiko Kitajima, San Jose, CA (US); Sung-Kwan Kang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 108 days.

(21) Appl. No.: 17/147,578

(22) Filed: Jan. 13, 2021

(65) Prior Publication Data

US 2021/0233779 A1    Jul. 29, 2021

Related U.S. Application Data

(60) Provisional application No. 62/964,934, filed on Jan. 23, 2020.

(51) Int. Cl.
| | | |
|---|---|---|
| *H01L 21/321* | (2006.01) | |
| *H01L 27/11582* | (2017.01) | |
| *H01L 21/768* | (2006.01) | |
| *H01L 23/522* | (2006.01) | |

(52) U.S. Cl.
CPC ...... *H01L 21/321* (2013.01); *H01L 21/76877* (2013.01); *H01L 23/5226* (2013.01); *H01L 27/11582* (2013.01)

(58) Field of Classification Search
CPC ............. H01L 21/321; H01L 21/76877; H01L 23/5226; H01L 27/11582; H01L 29/40117
See application file for complete search history.

(56) References Cited

U.S. PATENT DOCUMENTS

| | | | |
|---|---|---|---|
| 8,188,445 B2 * | 5/2012 | Godet et al. | |
| 8,536,029 B1 | 9/2013 | Chang et al. | |
| 8,623,171 B2 | 1/2014 | Godet et al. | |
| 9,190,498 B2 | 11/2015 | Brand et al. | |
| 9,385,195 B1 | 7/2016 | Zhang | |
| 9,502,518 B2 * | 11/2016 | Katsuki | |
| 9,953,983 B2 | 4/2018 | Zhang | |
| 9,960,045 B1 | 5/2018 | Purayath | |
| 10,043,819 B1 | 8/2018 | Lai et al. | |
| 10,319,739 B2 | 6/2019 | Purayath | |
| 10,325,923 B2 | 6/2019 | Purayath | |
| 10,354,916 B2 | 6/2019 | Chen et al. | |
| 10,410,869 B2 | 9/2019 | Roy et al. | |
| 10,468,259 B2 | 11/2019 | Purayath et al. | |

(Continued)

FOREIGN PATENT DOCUMENTS

| | | | |
|---|---|---|---|
| WO | WO2018/195423 | * | 4/2018 |
| WO | 2018195423 A1 | | 10/2018 |

*Primary Examiner* — Karen Kusumakar
(74) *Attorney, Agent, or Firm* — Servilla Whitney LLC

(57) ABSTRACT

Memory devices and methods of manufacturing memory devices are provided. The device and methods described suppress oxidation of metal layers exposed to ambient oxygen. After an opening is formed, a nitridation process occurs to nitridate the surface of the exposed metal layer inside the opening. The nitridated region formed on the surface of metal layer inside the opening works as a barrier layer for oxygen diffusion. In addition, the nitridated region works as an electrode for charge trap memory cells.

17 Claims, 12 Drawing Sheets

(56) References Cited

U.S. PATENT DOCUMENTS

| | | |
|---|---|---|
| 10,529,737 B2 | 1/2020 | Purayath |
| 10,541,246 B2 | 1/2020 | Purayath |
| 10,553,604 B2 | 2/2020 | Lu et al. |
| 10,622,251 B2 | 4/2020 | Chen et al. |
| 10,790,298 B2 | 9/2020 | Purayath |
| 10,886,172 B2 | 1/2021 | Chen |
| 10,964,717 B2 | 3/2021 | Kang et al. |
| 10,998,329 B2 | 5/2021 | Koshizawa et al. |
| 11,024,371 B2 | 6/2021 | Cui et al. |
| 11,049,695 B2 | 6/2021 | Kang et al. |
| 11,049,880 B2 * | 6/2021 | Rajashekhar ..... H01L 27/11524 |
| 2007/0042548 A1 | 2/2007 | Noh et al. |
| 2008/0136040 A1 * | 6/2008 | Park .................. H01L 23/53223 438/631 |
| 2011/0291190 A1 | 12/2011 | Xiao et al. |
| 2012/0258600 A1 | 10/2012 | Godet et al. |
| 2013/0306935 A1 | 11/2013 | Chang et al. |
| 2014/0034611 A1 | 2/2014 | Godet et al. |
| 2014/0175530 A1 | 6/2014 | Chien et al. |
| 2015/0123189 A1 | 5/2015 | Sun et al. |
| 2015/0325411 A1 | 9/2015 | Godet |
| 2016/0111513 A1 | 4/2016 | Liu et al. |
| 2016/0190312 A1 | 6/2016 | Zhang et al. |
| 2017/0069637 A1 | 3/2017 | Son et al. |
| 2017/0278864 A1 | 9/2017 | Hu et al. |
| 2018/0090307 A1 | 3/2018 | Brunner et al. |
| 2018/0144977 A1 | 5/2018 | Yu et al. |
| 2018/0330985 A1 | 11/2018 | Yu et al. |
| 2019/0393042 A1 | 12/2019 | Roy et al. |
| 2020/0051994 A1 | 2/2020 | Purayath et al. |
| 2020/0118822 A1 | 4/2020 | Falk et al. |
| 2020/0185408 A1 * | 6/2020 | Song ................... H01L 29/0847 |
| 2020/0203373 A1 | 6/2020 | Kang et al. |
| 2020/0266211 A1 | 8/2020 | Tao et al. |
| 2020/0312874 A1 | 10/2020 | Kang et al. |
| 2020/0350014 A1 | 11/2020 | Liu |
| 2020/0350287 A1 | 11/2020 | Liu |
| 2020/0402562 A1 | 12/2020 | Li et al. |
| 2020/0411509 A1 | 12/2020 | Vang et al. |
| 2021/0043643 A1 | 2/2021 | Lu et al. |
| 2021/0126005 A1 | 4/2021 | Lu et al. |
| 2021/0210142 A1 | 7/2021 | Liu |
| 2021/0217773 A1 | 7/2021 | Kang et al. |
| 2021/0225865 A1 | 7/2021 | Wu |
| 2021/0233779 A1 | 7/2021 | Kang et al. |
| 2021/0233918 A1 | 7/2021 | Koshizawa et al. |
| 2021/0249436 A1 | 8/2021 | Ding et al. |
| 2021/0257375 A1 * | 8/2021 | Koshizawa ....... H01L 27/11575 |
| 2021/0257385 A1 | 8/2021 | Hu et al. |
| 2021/0257386 A1 | 8/2021 | Wang et al. |
| 2021/0257387 A1 | 8/2021 | Huang et al. |

\* cited by examiner

3D-NAND MEMORY CELL STRUCTURE

CROSS-REFERENCE TO RELATED APPLICATIONS

This application claims priority to U.S. Provisional Application No. 62/964,934, filed Jan. 23, 2020, the entire disclosure of which is hereby incorporated by reference herein.

TECHNICAL FIELD

Embodiments of the present disclosure pertain to the field of electronic devices and methods and apparatus for manufacturing electronic devices. More particularly, embodiments of the disclosure provide methods for forming 3D-NAND memory cells.

BACKGROUND

Semiconductor technology has advanced at a rapid pace and device dimensions have shrunk with advancing technology to provide faster processing and storage per unit space. In NAND devices, the string current needs to be high enough to obtain sufficient current to differentiate ON and OFF cells. The string current is dependent on the carrier mobility which is enhanced by enlarging the grain size of the silicon channel.

Existing 3D-NAND memory stacks with alternating layers of oxide and nitride require replacement metal gate (RMG) processes to build wordlines. Because the stack height is becoming thicker, high aspect ratio (HAR) memory hole etch/fill processes and stress control are becoming more difficult. The alternating layers of oxide and nitride film stack can be a candidate to avoid replacement metal gate (RMG) steps and get stack height thinner.

For non-replacement metal gate (RMG) process, cell components must be protected from the diffusion of metal from metal and protect metal from oxidation during heat process in oxygen ambient.

Accordingly, there is a need in the art for 3D-NAND devices having thinner stack heights and where cell components and metal layers are protected. Additionally, there is a need in the art for methods and apparatus for forming the 3D-NAND devices.

SUMMARY

One or more embodiments of the disclosure are directed to method of forming memory devices. In one embodiment, a method of forming an electronic device comprises: forming an opening through a metal stack comprising alternating layers of a first material layer and a metal layer; and selectively nitridating the metal layer through the opening to form a nitridated region.

Additional embodiments of the disclosure are directed to semiconductor memory devices. In one an embodiment, a semiconductor memory device comprises: a metal stack comprising alternating first material layers and metal layers in a first portion of the device; and a memory stack in a second portion of the device, the memory stack comprising alternating first material layers and wordlines, the wordlines comprising a metal layer with a metal nitridated region, a plurality of bitlines extending through the memory stack, and wordline contacts extending from a top surface of the wordlines.

Further embodiments of the disclosure are directed to processing tools. In one embodiment, a processing tool comprises: a central transfer station comprising a robot configured to move a wafer; a plurality of process stations, each process station connected to the central transfer station and providing a processing region separated from processing regions of adjacent process stations, the plurality of process stations comprising a nitridation chamber; and a controller connected to the central transfer station and the plurality of process stations, the controller configured to activate the robot to move the wafer between process stations, and to control a process occurring in each of the process stations.

BRIEF DESCRIPTION OF THE DRAWING

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

Existing 3D-NAND memory stacks with alternating layers of oxide and nitride require replacement metal gate (RMG) process to build wordlines. Because the stack height is becoming thicker, high aspect ratio (HAR) memory hole etch/fill processes and stress control are becoming more difficult.

One or more embodiments advantageously provide non-replacement metal gate (RMG) process that result in thinner stack heights. In one or more embodiments, the memory cell components are protected from the diffusion of metal from metal and metal is protected from oxidation during exposure to thermal processes in an oxidizing atmosphere. Especially, memory cell components are deposited from the side of memory hole etch when metal stacks are exposed to oxidation ambient.

Figure 1:
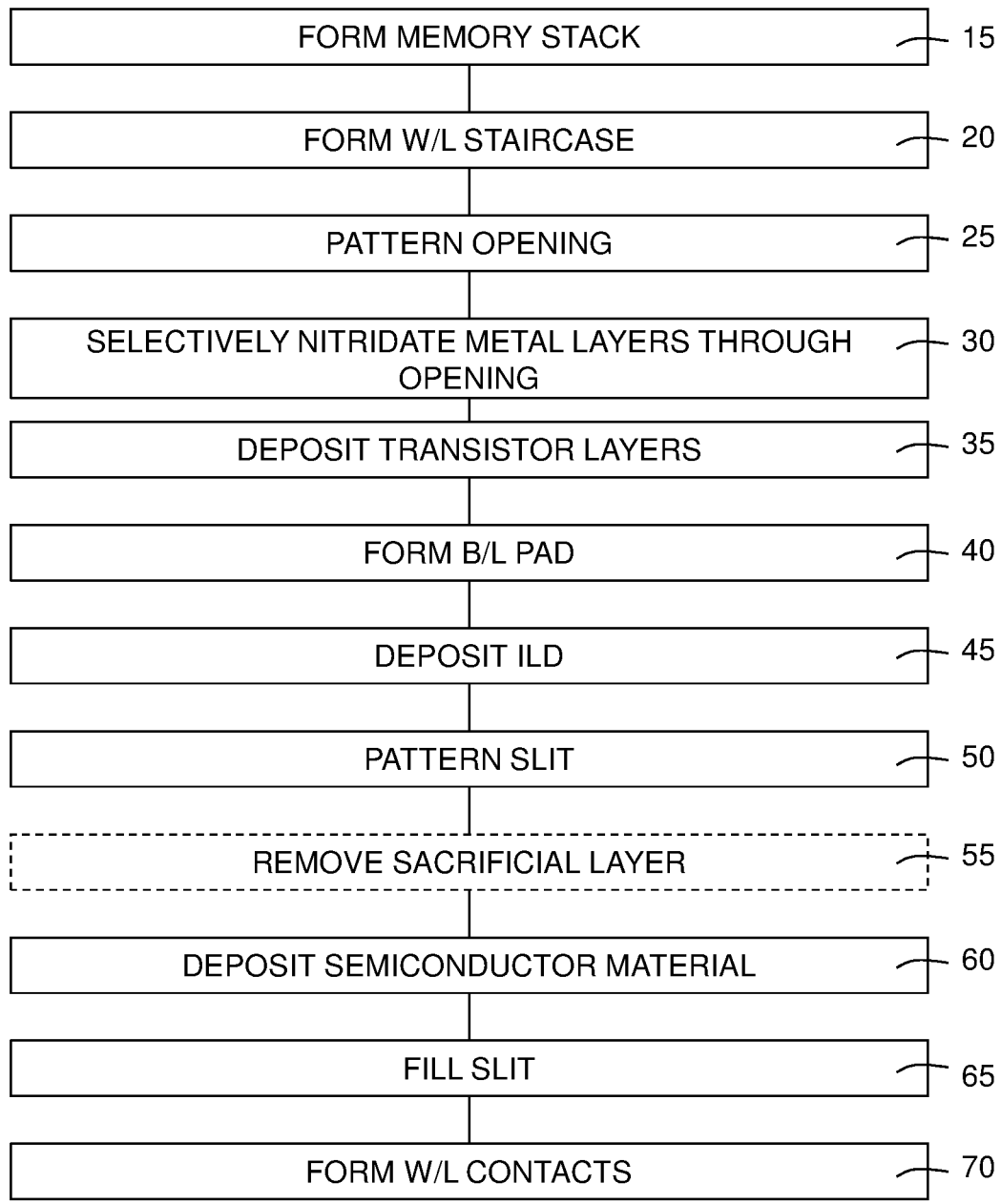
FIG. 1 depicts a flow process diagram of one embodiment of a method of forming a memory device according to embodiments described herein.

To control the surface between poly-silicon and the metal, metal deposition and other processes can be carried out in an isolated environment (e.g., a cluster process tool). Accordingly, some embodiments of the disclosure provide integrated tool systems with related process modules to implement the methods. FIG. 1 illustrates a process flow diagram for an exemplary method 10 for forming a memory device. The skilled artisan will recognize that the method 10 can include any or all of the processes illustrated. Additionally, the order of the individual processes can be varied for some portions. The method 10 can start at any of the enumerated processes without deviating from the disclosure. With reference to FIG. 1, at operation 15, a memory stack is formed. At operation 20, a wordline staircase is formed in the memory stack. At operation 25, an opening, e.g. a memory hole channel, is patterned into the wordline staircase. At operation 30, metals layers are nitridated through the opening. At operation 35, the transistor layers are deposited. At operation 40, the bitline pad is formed. At operation 45, an interlayer dielectric is deposited. At operation 50, the memory staircase is slit patterned. At operation 55, the sacrificial layer is removed. At operation 60, a semiconductor material is deposited. At operation 65, the slit is filled, and, at operation 70, the wordline contacts are formed.

FIGS. 2-18 illustrate a portion of a memory device 100 following the process flow illustrated for the method 10 in FIG. 1.

Figure 2:
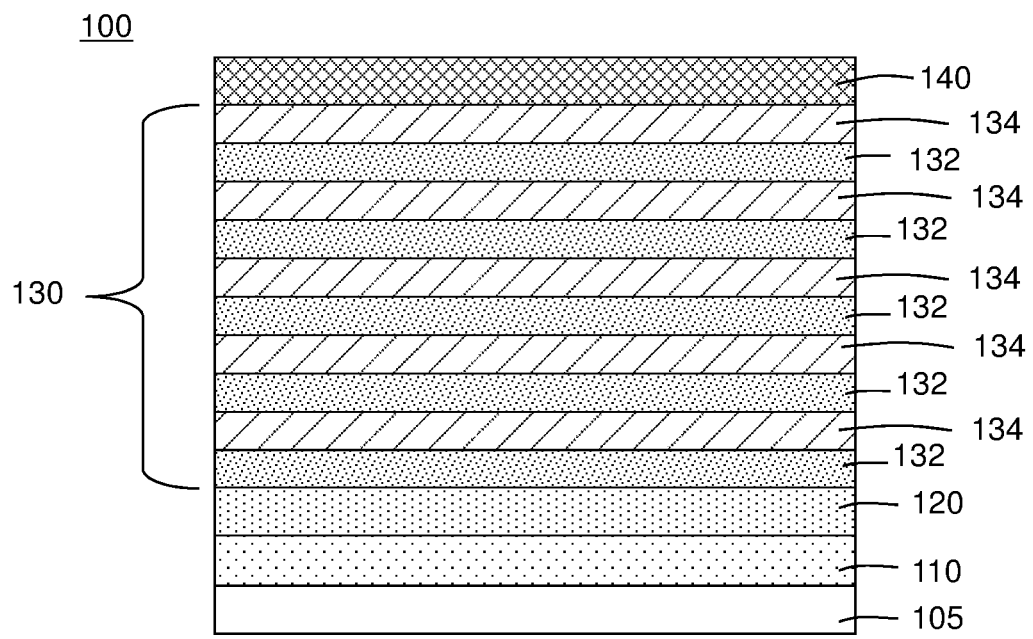
FIG. 2 illustrates a cross-sectional view of a device with a memory stack according to one or more embodiments.

FIG. 2 illustrates an initial or starting metal stack of an electronic device 100 in accordance with one or more embodiments of the disclosure. In some embodiments, the electronic device 100 shown in FIG. 2 is formed on the bare substrate 105 in layers, as illustrated. The electronic device of FIG. 2 is made up of a substrate 105, a semiconductor layer 110, a sacrificial layer 120, a metal stack 130 and an oxide layer 140.

The substrate 105 can be any suitable material known to the skilled artisan. As used in this specification and the appended claims, the term "substrate" refers to a surface, or portion of a surface, upon which a process acts. It will also be understood by those skilled in the art that reference to a substrate can refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

A semiconductor layer 110 is on the substrate 105. In one or more embodiments, the semiconductor layer 110 may also be referred to as the common source line. The semiconductor layer 110 can be formed by any suitable technique known to the skilled artisan and can be made from any suitable material including, but not limited to, poly-silicon (poly-Si). In some embodiments, the semiconductor layer 110 is a common source line that is made of a conductive or a semiconductor material. In some embodiments, the layers below the first metal layer 132 and the second metal layer stacks can be changed to form source line contacts. Any variation of structure beneath the first and second layer stacks is possible.

The sacrificial layer 120 is formed on the semiconductor layer 110 and can be made of any suitable material. The sacrificial layer 120 in some embodiments is removed and replaced in later processes. In some embodiments, the sacrificial layer 120 is not removed and remains within the memory device 100. In this case, the term "sacrificial" has an expanded meaning to include permanent layers and may be referred to as the conductive layer. In the illustrated embodiment, as described further below, the sacrificial layer 120 is removed in operation 55. In one or more embodiments, the sacrificial layer 120 comprises a material that can be removed selectively versus the neighboring semiconductor layer 110 and metal layer 134.

A metal stack 130 is formed on the sacrificial layer 120. The metal stack 130 in the illustrated embodiment comprises a plurality of alternating first material layers 132 and metal layers 134. In some embodiments, the metal stack 130 comprises a non-replacement gate such as metal and metal, metal and metal nitride, or oxide and metal. The metal layers 134 comprise a metal that is selective to nitridation over the first material layers 132 so that metal layers 134 can be nitridated without substantially affecting the first material layers 132. In one or more embodiments, the first material layers 132 comprise one or more of tungsten (W), molybdenum (Mo), tantalum (Ta), niobium (Nb), osmium (Os), zirconium (Zr), iridium (Ir), rhenium (Re), titanium (Ti), titanium nitride (TiN), tantalum nitride (TaN), tungsten nitride (WN), molybdenum nitride (MoN), zirconium nitride (ZrN), silicon oxide ($SiO_2$), ruthenium oxide ($RuO_x$), iridium oxide ($IrO_x$), tungsten oxide ($WO_x$), silicon nitride (SiN), and the like. In one or more embodiments, the metal layers 134 comprise one or more of tungsten (W), molybdenum (Mo), tantalum (Ta), ruthenium (Ru), niobium (Nb), osmium (Os), zirconium (Zr), iridium (Ir), rhenium (Re), titanium (Ti), and the like. Thus, in one or more embodiments, the alternating layers of first material layers 132 and metal layers 134 comprise one or more of titanium nitride/tungsten (TiN/W), silicon oxide/tungsten ($SiO_2$/W), tungsten/molybdenum (W/Mo), tungsten oxide/tungsten ($WO_x$/W), and titanium nitride/molybdenum (TiN/Mo). In one or more embodiments, the first material layers 132 and metal layers 134 do not comprise the same material. In one or more specific embodiments, the first material layers 132 comprise titanium nitride (TiN). In one or more specific embodiments, the metal layers 143 comprise tungsten. In one or more embodiments first material layers 132 and metal layers 134 are deposited by chemical vapor deposition (CVD) or physical vapor deposition (PVD).

The individual alternating layers may be formed to any suitable thickness. In some embodiments, the thickness of each metal layer 134 is approximately equal. In one or more embodiments, each metal layer 134 has a first metal layer thickness. In some embodiments, the thickness of each first material layer 132 is approximately equal. As used in this regard, thicknesses which are approximately equal are within +/−5% of each other.

Figure 3:
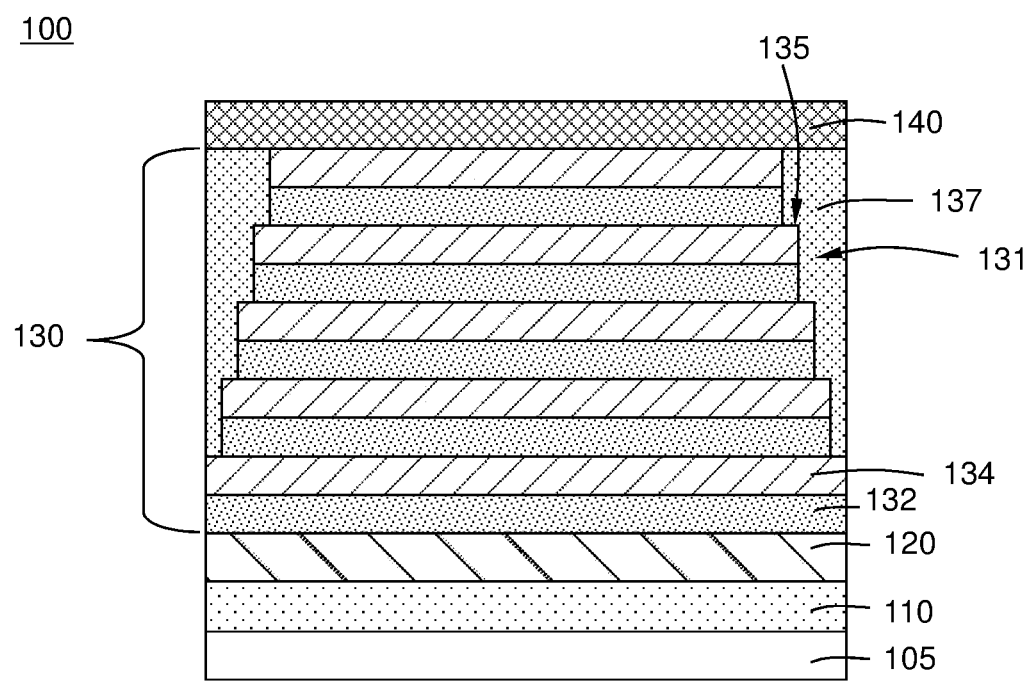
FIG. 3 illustrates a cross-sectional view of a substrate after forming a staircase pattern of the memory stack according to one or more embodiments.

Referring to FIG. 3, in one or more embodiments, at operation 20 of method 10, a staircase formation 131 is created. The staircase formation 131 exposes a top surface 135 of the metal layers 134. The top surface 135 can be used to provide space for wordline contacts to be formed, as described below. A suitable fill material 137 can be deposited to occupy the space outside the staircase formation 131. A suitable fill material 137, as will be understood by the skilled artisan, can be any material that prevents electrical shorting between adjacent wordlines. A staircase formation 131 with each wordline having a smaller width (illustrated from left-to-right in the figures) than the wordline below. Use of relative terms like "above" and "below" should not be taken as limiting the scope of the disclosure to a physical orientation in space.

Figure 4A:
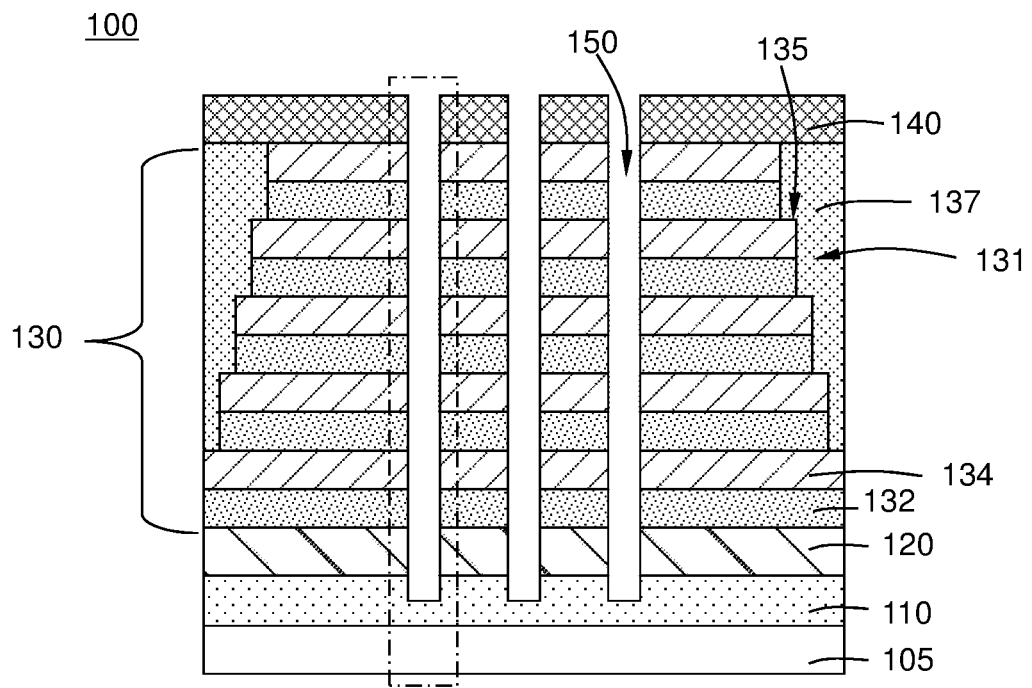
FIG. 4A illustrates a cross-sectional view of a substrate after formation of an opening according to one or more embodiments.
Figure 4B:
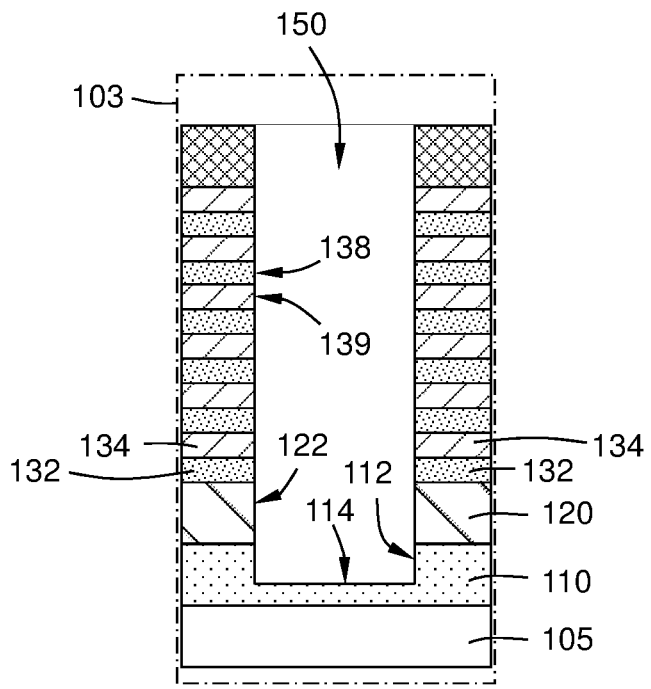
FIG. 4B illustrates a cross-sectional view region 103 of the substrate of FIG. 4A according to one of more embodiments.

Referring to FIGS. 4A and 4B, at operation 25, in one or more embodiments, an opening 150 is opened through the metal stack 130. In some embodiments, the opening 150 comprises a memory hole channel. In some embodiments, opening the opening 150 comprises etching through the oxide layer 140, metal stack 130, sacrificial layer 120, and into semiconductor layer 110. Referring to FIG. 4B, which is an expanded view of region 103, the opening 150 has sidewalls that extend through the metal stack 130 exposing surfaces 138 of the first material layers 132 and surface 139 of the metal layers 134.

In one or more embodiments, the sacrificial layer 120 has surfaces 122 exposed as sidewalls of the opening 150. The opening 150 extends a distance into the semiconductor layer 110 so that sidewall surface 112 and bottom 114 of the opening 150 are formed within the semiconductor layer 110. The bottom 114 of the opening 150 can be formed at any point within the thickness of the semiconductor layer 110. In some embodiments, the opening 150 extends a thickness into the semiconductor layer 110 in the range of about 10% to about 90%, or in the range of about 20% to about 80%, or in the range of about 30% to about 70%, or in the range of about 40% to about 60% of the thickness of the semiconductor layer 110. In some embodiments, the opening 150 extends a distance into the semiconductor layer 110 by greater than or equal to 10%, 20%, 30%, 40%, 50%, 60%, 70% or 80% of the thickness of the semiconductor layer 110.

Figure 5A:
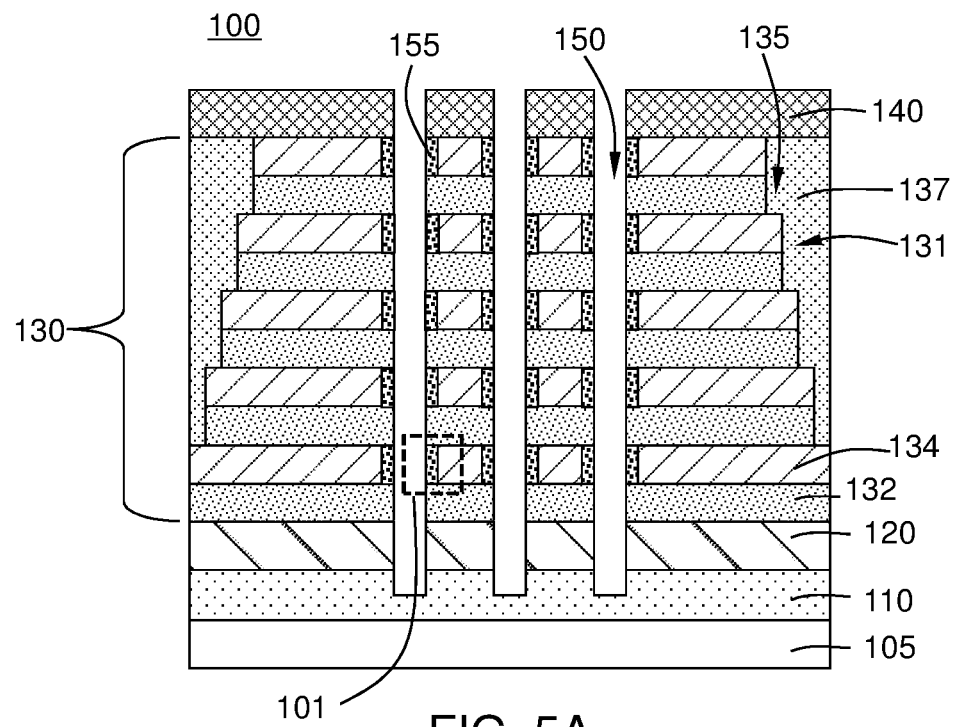
FIG. 5A illustrates a cross-sectional view of a substrate after selective nitridation of a metal layer according to one or more embodiments.
Figure 5B:
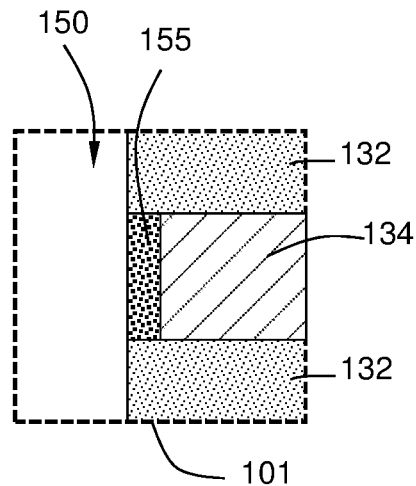
FIG. 5B illustrates an expanded view of region 101 according to one or more embodiments.

FIG. 5A shows operation 30 in which the metal layers 134 are nitridated through the opening 150. FIG. 5B is an expanded view of region 101 of FIG. 5A. In one or more embodiments, the metal layers 134 are nitridated by annealing in an atmosphere of ammonia ($NH_3$) at a temperature in a range of from about 400° C. to about 1000° C. at ambient pressure. In one or more embodiments, nitridation of the metal layer 134 forms a metal nitridated region 155 having a thickness in a range of from about 0.1 nm to about 10 nm, extending from the opening 150 to the metal layer 134.

In one or more embodiments, the metal nitridated region 155 comprises one or more of tungsten nitride (WN), molybdenum nitride (MoN), tantalum nitride (TaN), ruthenium nitride (RuN), niobium nitride (NbN), osmium nitride (OsN), zirconium nitride (ZrN), iridium nitride (IrN), rhenium nitride (ReN), titanium nitride (TiN), and the like. In one or more specific embodiments, the metal nitridated region 155 comprises tungsten nitride (WN).

Figure 5C:
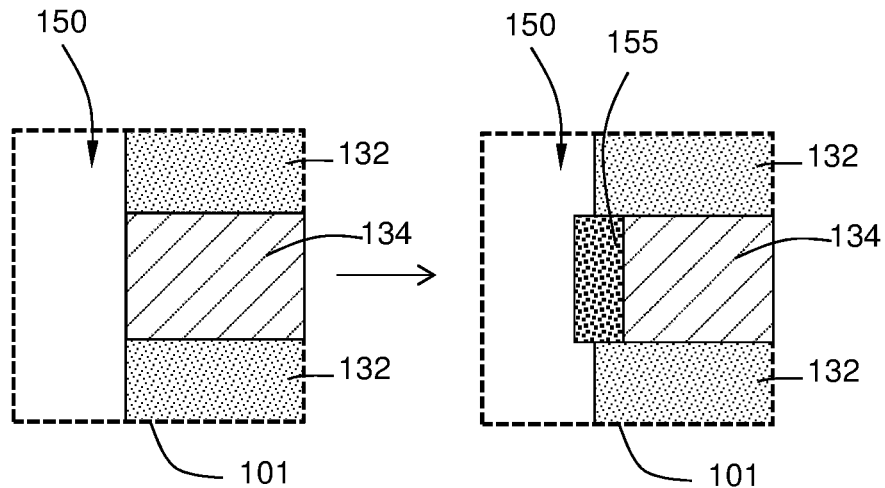
FIG. 5C illustrates an expanded view of region 101 according to one or more embodiments.
Figure 5D:
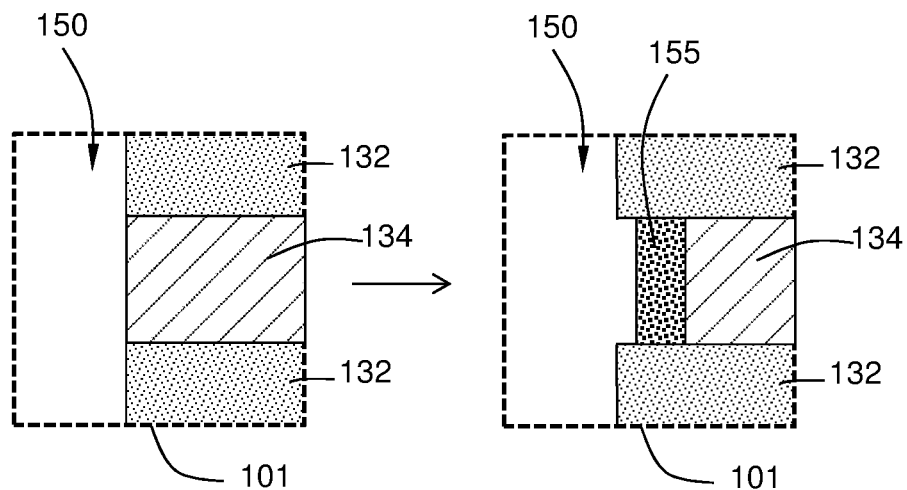
FIG. 5D illustrates an expanded view of region 101 according to one or more embodiments.

With reference to FIGS. 5C and 5D, one or more alternative embodiments are illustrated. As illustrated in FIG. 5C, in one or more embodiments, the metal nitridated region 155 protrudes into the opening 150. In other embodiments, referring to FIG. 5D, the metal layers 134 are recessed through the opening 150. In some embodiments, the metal layers 134 are recessed through the opening 150 using hydrogen peroxide ($H_2O_2$). The recessed metal layers 134 are then nitridated to form a recessed metal nitridated region 155.

Without intending to be bound by theory, it is thought that the 3-D NAND structure of one or more embodiments and the method of nitridating the metal layers 134 of one or more embodiments suppress oxidation of the metal layer 134. The metal nitridated region 155 formed on the surface of metal layer 134 inside of opening 150 works as a barrier layer for oxygen diffusion. In addition, the metal nitridated region 155 works as an electrode for charge trap memory cells.

In one or more embodiments, the presence of the metal nitride region 155 suppressed oxidation of the metal stack 130, so that changes in the volume or interface properties between high-k dielectrics and metal gate can be avoided. In one or more embodiments, the metal nitride region 155 is a high work function metal nitride which is desired for charged trap based flash memory cell with low cost and reduced process steps. In one or more embodiments, diffusion of metal from metal layer 134 into a charge trap based cell can be avoided during high temperature processes.

Figure 6A:
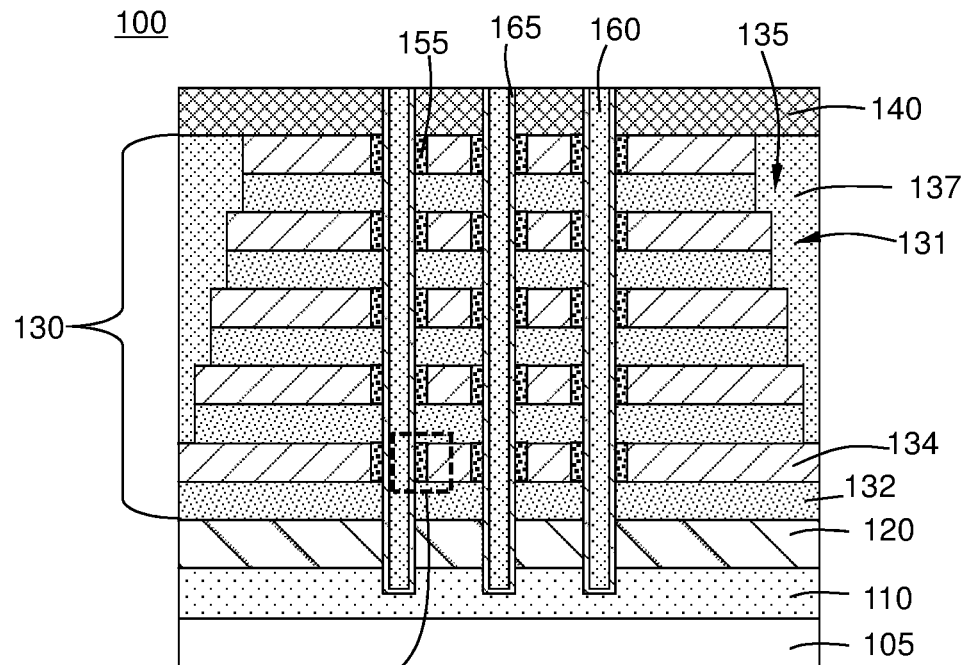
FIG. 6A illustrates a cross-sectional view of a substrate according to one or more embodiments.
Figure 6B:
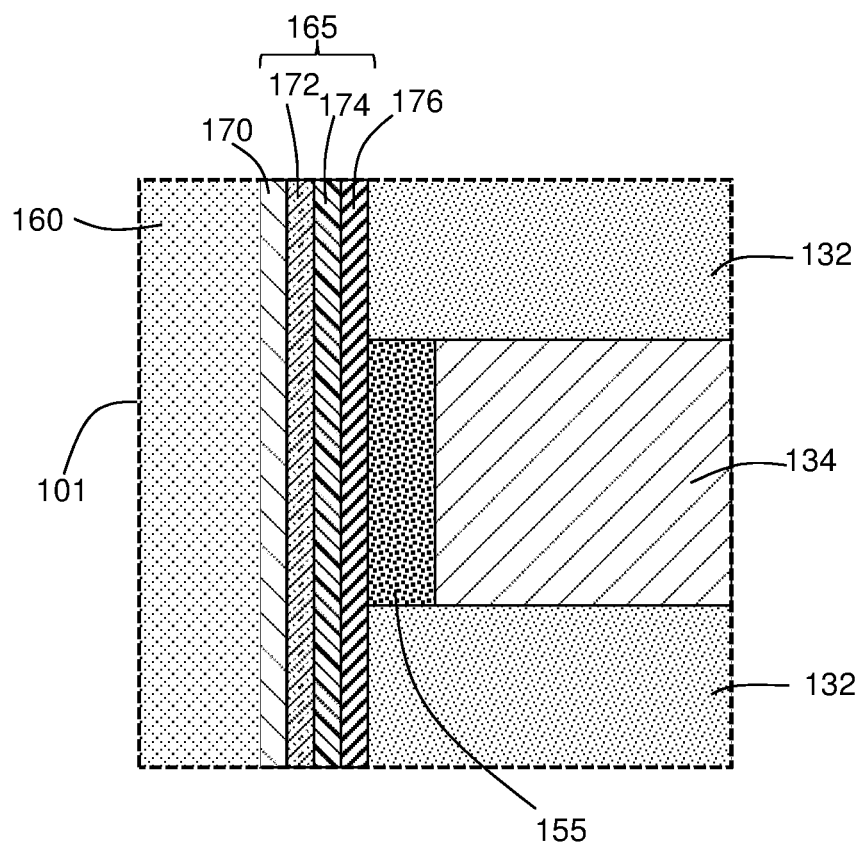
FIG. 6B illustrates an expanded view of region 101 after according to one or more embodiments.

FIGS. 6A and 6B show operation 35 in which transistor layers 165 are conformally deposited into opening 150 adjacent the metal layers 134 and the metal nitride region 155. The transistor layers 165 can be formed by any suitable technique known to the skilled artisan. In some embodiments, the transistor layers 165 are formed by a conformal deposition process. In some embodiments, the transistor layers 165 are formed by one or more of atomic layer deposition or chemical vapor deposition.

In one or more embodiments, the deposition of the transistor layers 165 is substantially conformal. As used herein, a layer which is "substantially conformal" refers to a layer where the thickness is about the same throughout (e.g., on the top, middle and bottom of sidewalls and on the bottom of the opening 150). A layer which is substantially conformal varies in thickness by less than or equal to about 5%, 2%, 1% or 0.5%.

Referring to FIG. 6B, which is an expanded view of region 101, in one or more embodiments, the transistor layers 165 comprises a blocking oxide layer 176 (or a first oxide layer 176), a nitride trap layer 174 on the first oxide layer 176, a second oxide layer 172 (or the tunneling oxide layer 172) on the nitride trap layer 174 and a poly-silicon layer 170 in the opening 150 on the second oxide layer 172. In one or more embodiments, the blocking oxide layer 176, the charge trap nitride (SiN) layer 174, and the tunneling oxide layer 172 are deposited in the opening 150 on the sidewalls of the opening 150 or on the semiconductor layer 110. In one or more embodiments, before forming a blocking oxide, high-k dielectric materials, such as aluminum oxide or hafnium oxide, may be deposited (i.e. blocking layer is composed of high-k dielectric and silicon oxide).

In one or more embodiments a poly-silicon (poly-Si) layer 170 is formed in the opening 150 adjacent to the transistor layers 165. The poly-Si layer 170 can be formed directly on the transistor layers 165. The poly-Si layer 170 can be deposited by any suitable technique known to the skilled artisan, including, but not limited to, atomic layer deposition and chemical vapor deposition. In some embodiments, the poly-Si layer 170 is deposited as a conformal layer so that the poly-silicon layer is formed on sidewalls and exposed surface 138, 139, 122, 112 and bottom 114 (see FIG. 4B) of the opening 150.

The poly-silicon layer 170 can have any suitable thickness depending on, for example, the dimensions of the opening 150. In some embodiments, the poly-silicon layer 170 has a thickness in the range of about 0.5 nm to about 50 nm, or in the range of about 0.75 nm to about 35 nm, or in the range of about 1 nm to about 20 nm. In some embodiments, the poly-silicon layer 170 is a continuous film. In one or more embodiments, the poly-silicon layer 170 is formed in a macaroni type with conformal deposition on the tunnel oxide layer 172, the poly-silicon layer 170 having a thickness in a range of about 1 nm to about 20 nm. Then, the opening 150 is filled with a dielectric material 160.

Figure 7:
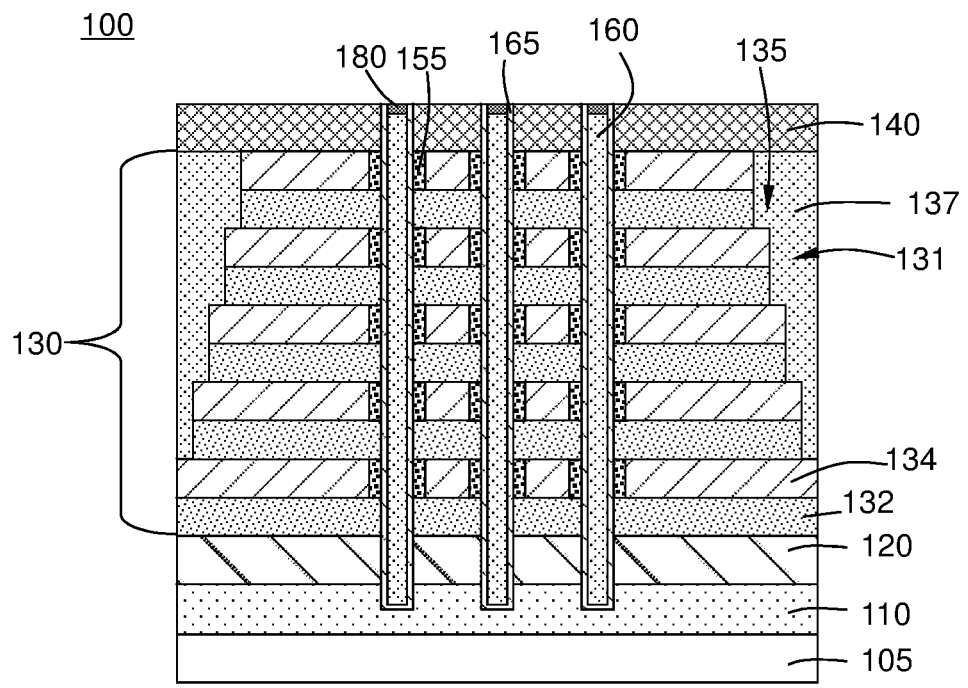
FIG. 7 illustrates a cross-sectional view of a substrate after formation of a bitline pad according to one or more embodiments.

FIG. 7 shows operation 40 of method 10 where a bitline pad 180 is formed in the poly-silicon (poly-Si) layer 160. The bitline pad 180 can be any suitable material known to the skilled artisan including, but not limited to, poly-silicon.

Figure 8:
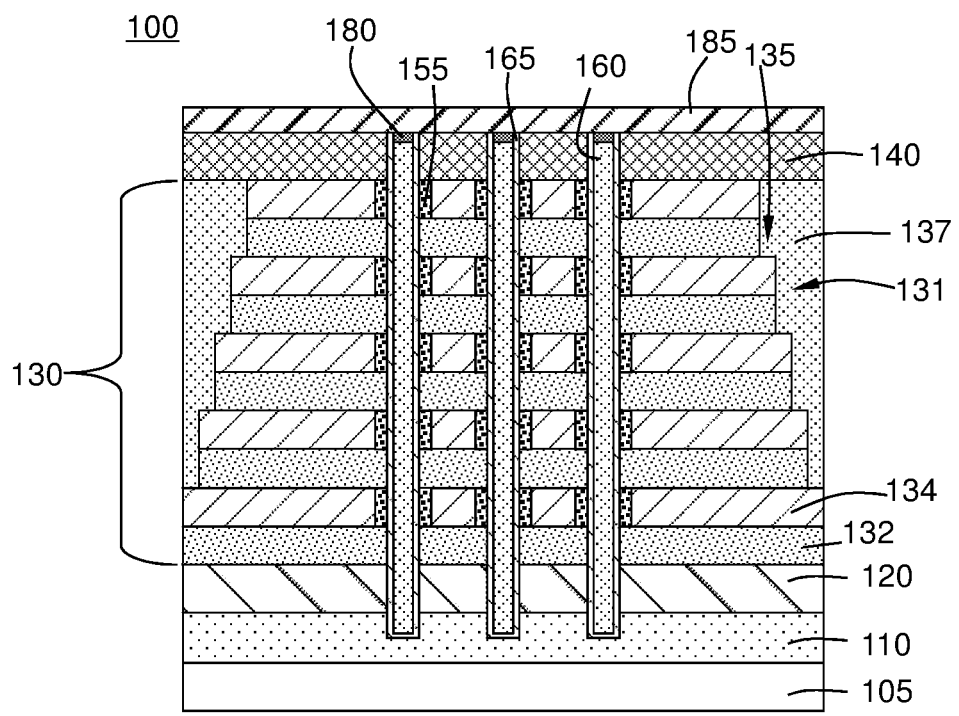
FIG. 8 illustrates a cross-sectional view of a substrate after deposition of an interlayer dielectric according to one or more embodiments.

FIG. 8 shows operation 45 of method 10 where an interlayer dielectric 185 is deposited on a top surface of the oxide layer 140 and the bitline pad 180. The interlayer dielectric (ILD) 185 may be deposited by any suitable technique known to one of skill in the art. The interlayer dielectric 185 may comprise any suitable material known to one of skill in the art. In one or more embodiments, the interlayer dielectric 185 is a low-K dielectric that includes, but is not limited to, materials such as, e.g., silicon dioxide, silicon oxide, carbon doped oxide ("CDO"), e.g., carbon doped silicon dioxide, porous silicon dioxide ($SiO_2$), silicon nitride (SiN), or any combination thereof. While the term "silicon oxide" may be used to describe the interlayer dielectric 185, the skilled artisan will recognize that the disclosure is not restricted to a particular stoichiometry. For example, the terms "silicon oxide" and "silicon dioxide" may both be used to describe a material having silicon and oxygen atoms in any suitable stoichiometric ratio. The same is true for the other materials listed in this disclosure, e.g. silicon nitride, silicon oxynitride, aluminum oxide, zirconium oxide, and the like.

Figure 9:
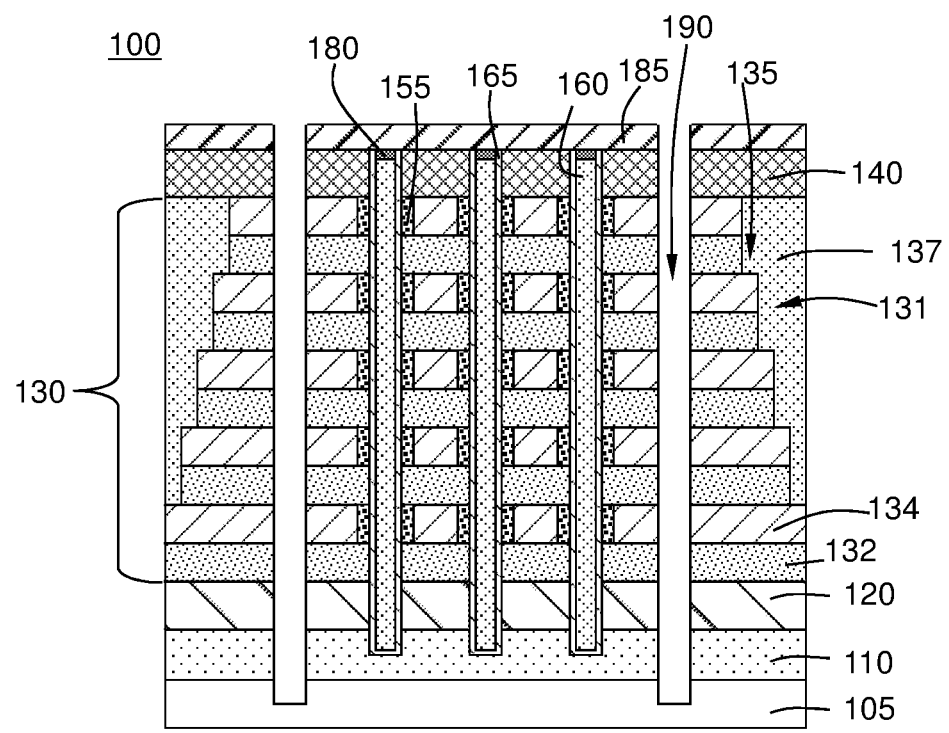
FIG. 9 illustrates a cross-sectional view of a substrate after slit patterning according to one or more embodiments.

FIG. 9 shows operation 50 of method 10 where the metal stack 130 is slit patterned to form slit pattern openings 190 that extend from a top surface of the interlayer dielectric 185 to the substrate 105.

Figure 10:
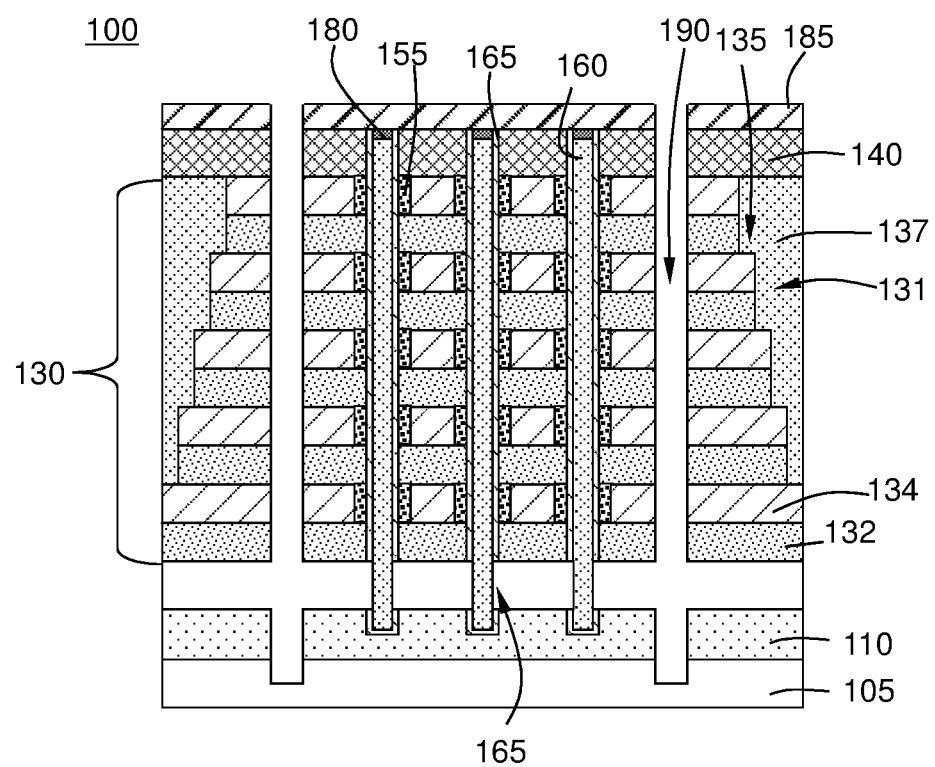
FIG. 10 illustrates a cross-sectional view of a substrate after a sacrificial layer is removed according to one or more embodiments.

FIG. 10 shows operation 55 of method 10 where the sacrificial layer 120 and transistor dielectrics (e.g. blocking layer, trap layer, and tunneling layer) adjacent to sacrificial layer 120 are removed to expose poly-Si channel layer. The sacrificial layer 120 and transistor dielectrics can be removed by any suitable technique known to the skilled artisan including, but not limited to, selective etching.

Figure 11:
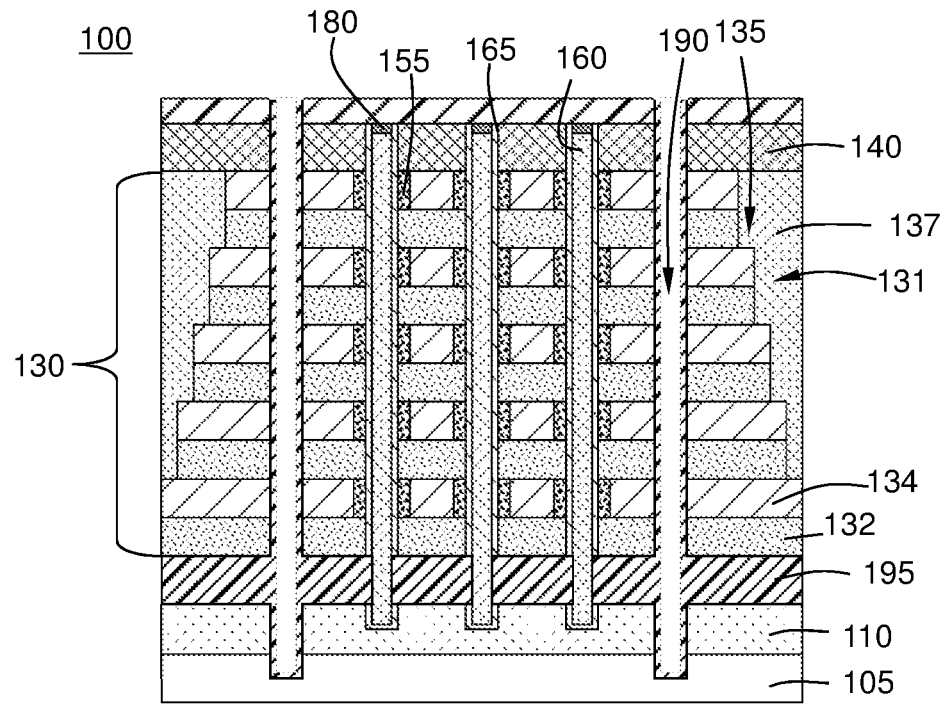
FIG. 11 illustrates a cross-sectional view of a substrate according to one or more embodiments.

FIG. 11 shows operation 60 of method 10 where a semiconductor material (e.g. poly-silicon fill) 195 is deposited in slit pattern opening 190. The semiconductor material may be any suitable material known to one of skill in the art.

Figure 12A:
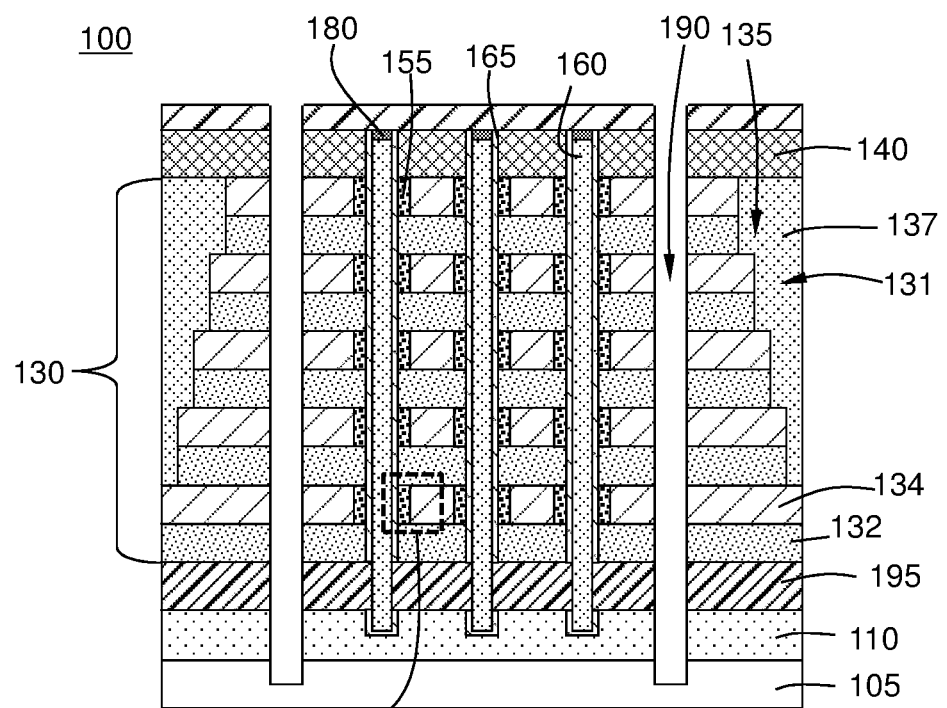
FIG. 12A illustrates a cross-sectional view of a substrate according to one or more embodiments.
Figure 12B:
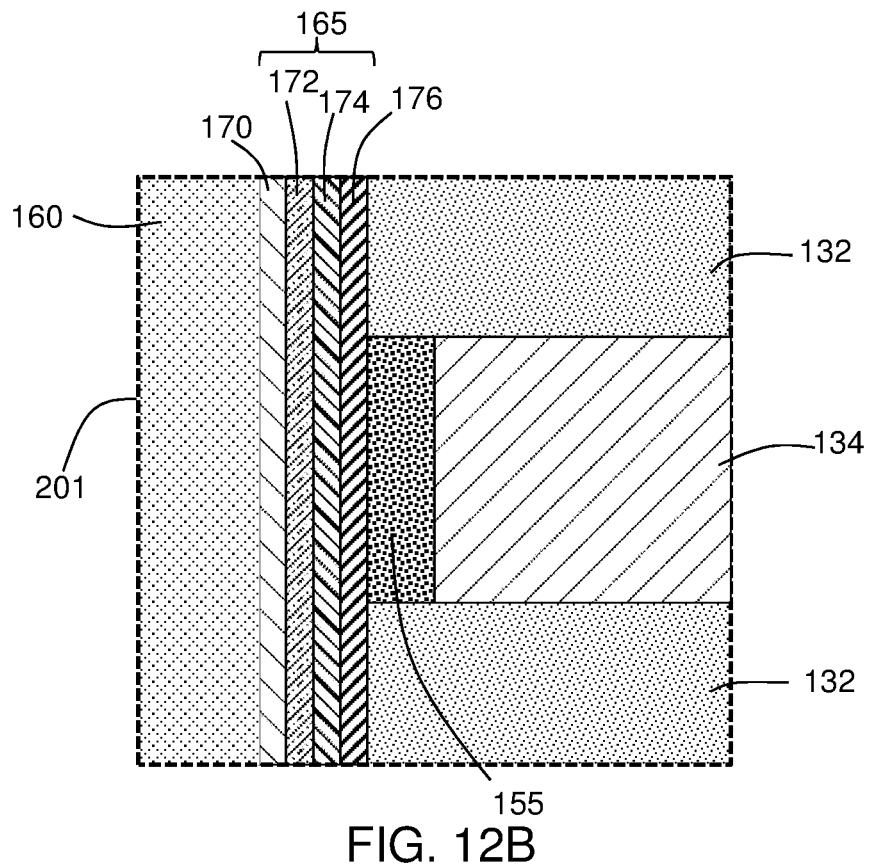
FIG. 12B illustrates an expanded view of region 101 of FIG. 12A.

FIG. 12A shows where the semiconductor material 195 is removed from the sidewalls of the slit pattern openings 190. Without intending to be bound by theory, the slit pattern openings 190 should be larger than common source line 110 (semiconductor layer 110) height so that there may be an opening in the slit pattern opening 190 in order to remove the semiconductor material 195 from the sidewalls. In one or more embodiments, the semiconductor material 195 is removed from the sidewalls of the slit pattern opening 190 by an isotropic etch process (e.g. wet etching using TMAH or the like). FIG. 12B shows an expanded view expanded view of region 101 of FIG. 12A.

Figure 13:
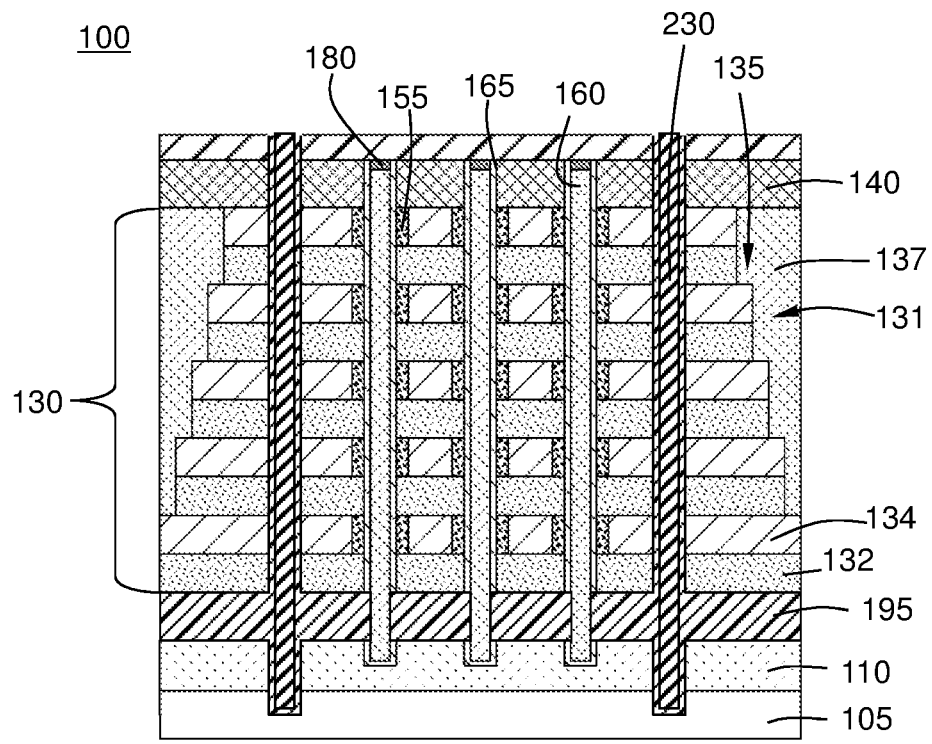
FIG. 13 illustrates a cross-sectional view of a substrate according to one or more embodiments.

FIG. 13 shows operation 80 of method 10 where the slit pattern opening 190 is filled with a fill material 230. The fill material 230 may be any suitable material known to one of skill in the art. In one or more embodiments, the fill material 230 comprises one or more of a dielectric material or a conductor material. As used herein, the term "dielectric material" refers to a layer of material that is an electrical insulator that can be polarized in an electric field. In one or more embodiments, the dielectric material comprises one or more of oxides, carbon doped oxides, silicon oxide (SiO), porous silicon dioxide ($SiO_2$), silicon nitride (SiN), silicon oxide/silicon nitride, carbides, oxycarbides, nitrides, oxynitrides, oxycarbonitrides, polymers, phosphosilicate glass, fluorosilicate (SiOF) glass, or organosilicate glass (SiOCH).

Figure 14:
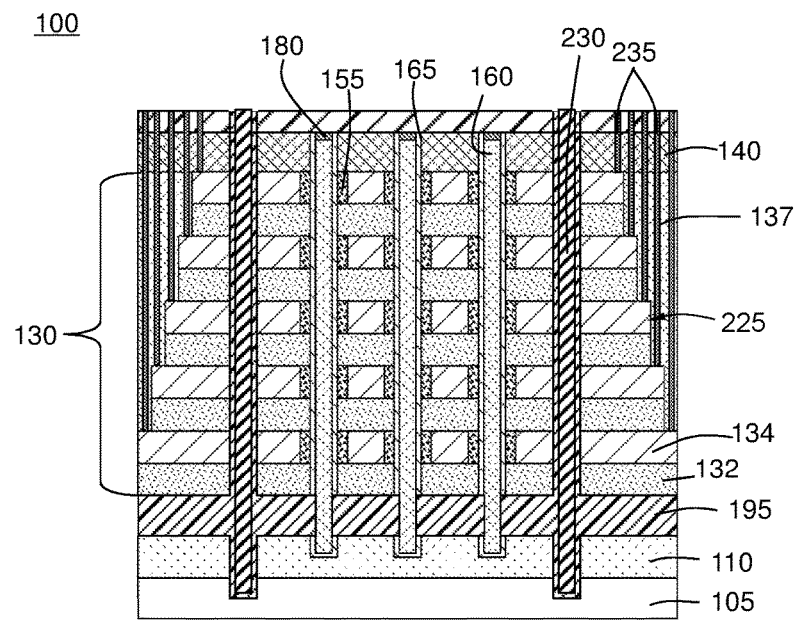
FIG. 14 illustrates a cross-sectional view of a substrate according to one or more embodiments.

FIG. 14 shows operation 85 of method 10 where wordline contacts 235 are formed. The wordline contacts 235 extend through the metal stack 130 a distance sufficient to terminate at one of the wordlines 225. In one or more embodiments, the wordline contacts 235 can comprise any suitable material known to the skilled artisan. In one or more embodiments, the wordline contact 235 comprises one or more of a metal, a metal silicide, poly-silicon, amorphous silicon, or EPI silicon. In one or more embodiments, the wordline contact is doped by either N type dopants or P type dopants in order to reduce contact resistance. In one or more embodiments, the metal of the wordline contact 235 is selected from one or more of copper (Cu), cobalt (Co), tungsten (W), titanium (Ti), molybdenum (Mo), nickel (Ni), ruthenium (Ru), silver (Ag), gold (Au), iridium (Ir), tantalum (Ta), and platinum (Pt).

Figure 15:
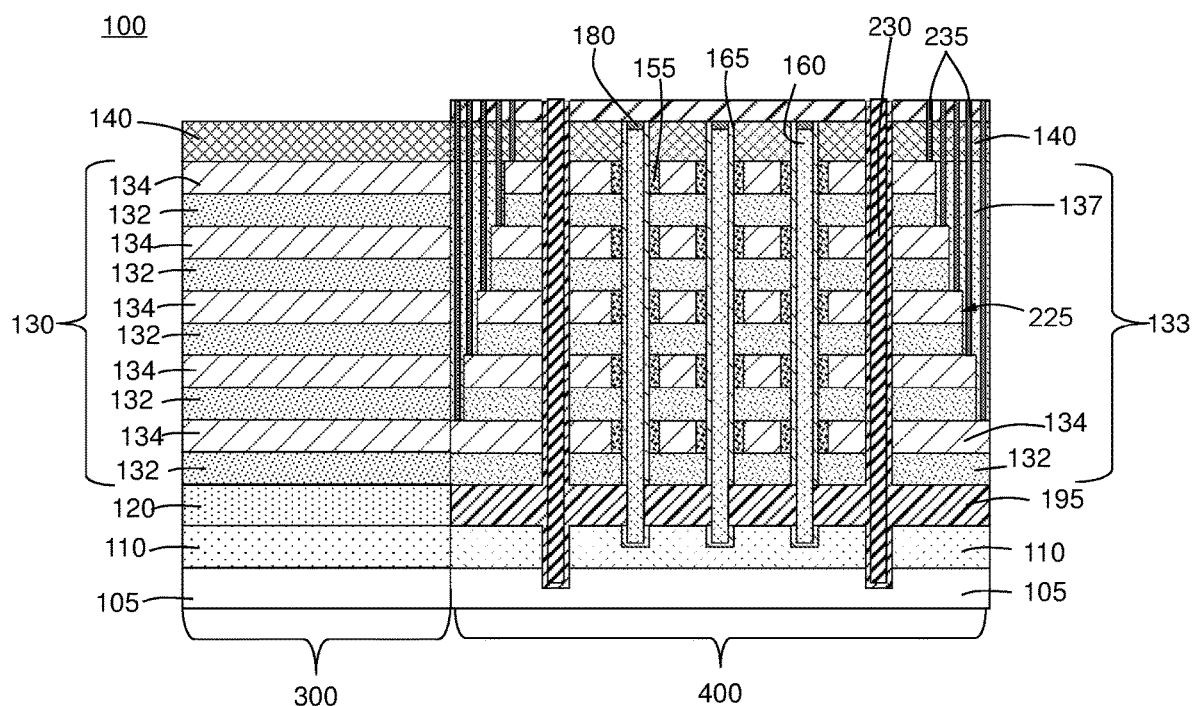
FIG. 15 illustrates a cross-sectional view of a substrate according to one or more embodiments.

FIG. 15 shows a semiconductor memory device according to one or more embodiments. The memory device 100 comprises: a metal stack 130 comprising alternating first material layers 132 and metal layers 134 in a first portion 300 of the device 100, and a memory stack 133 comprising alternating first material layers 132 and wordlines 225 in a second portion 400 of the device 100, the alternating wordlines 225 comprising a metal layer 134 with a metal nitridated region 155.

In one or more embodiments, the metal stack 130 has a height in a range of from about 10 nm to about 500 nm, including from about 12 nm to about 450 nm, and from about 15 nm to about 400 nm.

In one or more embodiments the first material layer 132 of the metal stack 130 has a thickness in the range of about 0.5 to about 40 nm, including about 0.5 nm to about 30 nm, including about 1 nm, about 3 nm, about 5 nm, about 7 nm, about 10 nm, about 12 nm, about 15 nm, about 17 nm, about 20 nm, about 22 nm, about 25 nm, about 27 nm, about 30 nm, about 35 nm, and about 40 nm. In one or more embodiments, the metal layers 134 of the metal stack 130 have an average thickness in the range of about 10 nm to about 20 nm.

The memory device 100 comprises a memory stack 133 comprising alternating first material layers 132 and wordlines 225 in a second portion 400 of the device 100, the alternating wordlines 225 comprising a metal layer 134 with a metal nitridated region 155.

Figure 16:
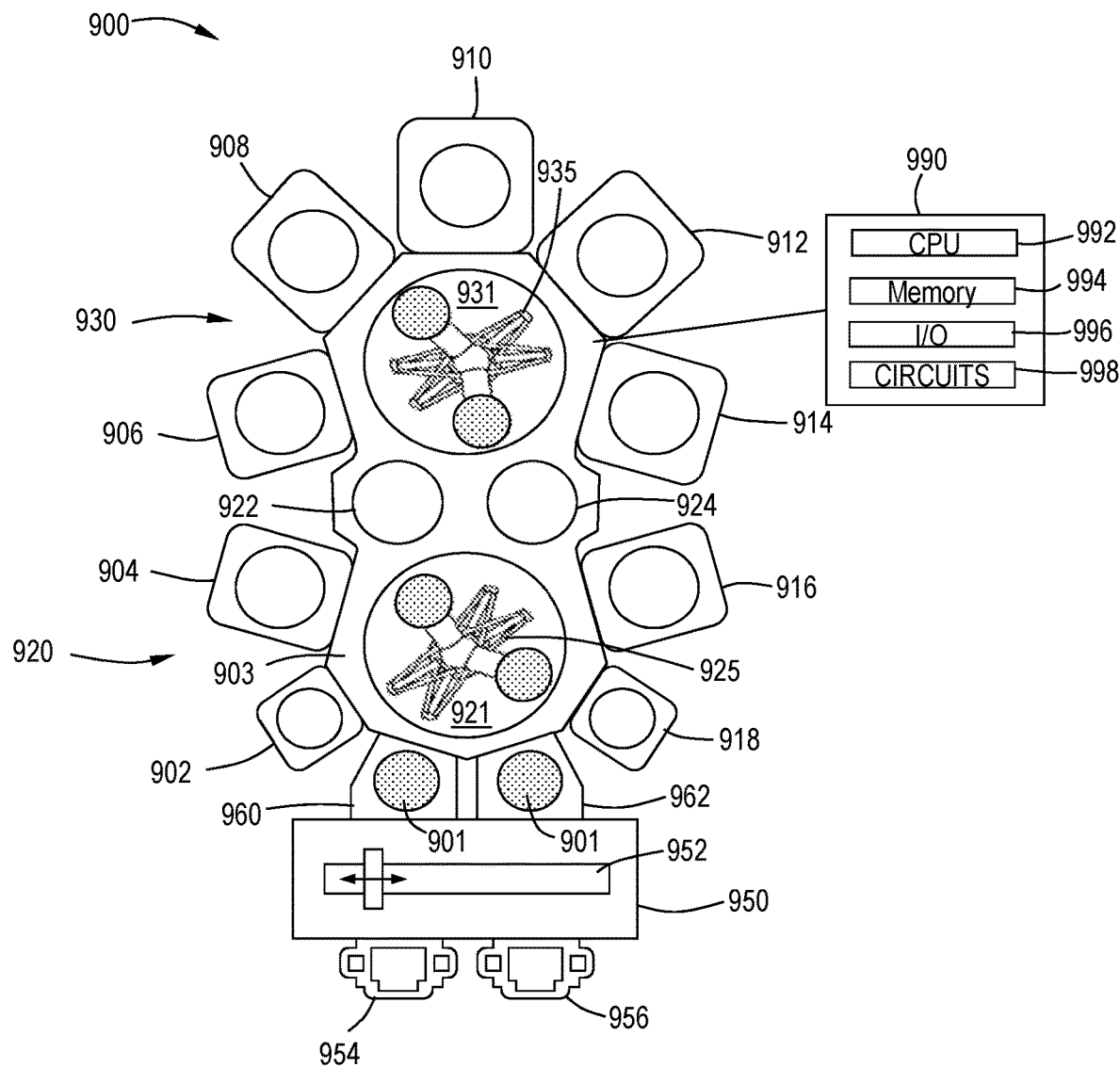
FIG. 16 illustrates a cluster tool according to one or more embodiments.

Additional embodiments of the disclosure are directed to processing tools 900 for the formation of the memory devices and methods described, as shown in FIG. 16.

The cluster tool 900 includes at least one central transfer station 921, 931 with a plurality of sides. A robot 925, 935 is positioned within the central transfer station 921, 931 and is configured to move a robot blade and a wafer to each of the plurality of sides.

The cluster tool 900 comprises a plurality of processing chambers 902, 904, 906, 908, 910, 912, 914, 916, and 918, also referred to as process stations, connected to the central transfer station. The various processing chambers provide separate processing regions isolated from adjacent process stations. The processing chamber can be any suitable chamber including, but not limited to, a preclean chamber, a buffer chamber, transfer space(s), a wafer orienter/degas chamber, a cryo cooling chamber, a deposition chamber, annealing chamber, etching chamber, a selective oxidation chamber, an oxide layer thinning chamber, or a wordline deposition chamber. The particular arrangement of process chambers and components can be varied depending on the cluster tool and should not be taken as limiting the scope of the disclosure.

In some embodiments, the cluster tool 900 includes a nitridation chamber. In some embodiments, the cluster tool 900 includes a pre-cleaning chamber connected to the central transfer station.

In the embodiment shown in FIG. 16, a factory interface 950 is connected to a front of the cluster tool 900. The factory interface 950 includes a loading chamber 954 and an unloading chamber 956 on a front 951 of the factory interface 950. While the loading chamber 954 is shown on the left and the unloading chamber 956 is shown on the right, those skilled in the art will understand that this is merely representative of one possible configuration.

The size and shape of the loading chamber 954 and unloading chamber 956 can vary depending on, for example, the substrates being processed in the cluster tool 900. In the embodiment shown, the loading chamber 954 and unloading chamber 956 are sized to hold a wafer cassette with a plurality of wafers positioned within the cassette.

A robot 952 is within the factory interface 950 and can move between the loading chamber 954 and the unloading chamber 956. The robot 952 is capable of transferring a wafer from a cassette in the loading chamber 954 through the factory interface 950 to load lock chamber 960. The robot 952 is also capable of transferring a wafer from the load lock chamber 962 through the factory interface 950 to a cassette in the unloading chamber 956. As will be understood by those skilled in the art, the factory interface 950 can have more than one robot 952. For example, the factory interface 950 may have a first robot that transfers wafers between the loading chamber 954 and load lock chamber 960, and a second robot that transfers wafers between the load lock 962 and the unloading chamber 956.

The cluster tool 900 shown has a first section 920 and a second section 930. The first section 920 is connected to the factory interface 950 through load lock chambers 960, 962. The first section 920 includes a first transfer chamber 921 with at least one robot 925 positioned therein. The robot 925 is also referred to as a robotic wafer transport mechanism. The first transfer chamber 921 is centrally located with respect to the load lock chambers 960, 962, process chambers 902, 904, 916, 918, and buffer chambers 922, 924. The robot 925 of some embodiments is a multi-arm robot capable of independently moving more than one wafer at a time. In some embodiments, the first transfer chamber 921 comprises more than one robotic wafer transfer mechanism. The robot 925 in first transfer chamber 921 is configured to move wafers between the chambers around the first transfer chamber 921. Individual wafers are carried upon a wafer transport blade that is located at a distal end of the first robotic mechanism.

After processing a wafer in the first section 920, the wafer can be passed to the second section 930 through a pass-through chamber. For example, chambers 922, 924 can be uni-directional or bi-directional pass-through chambers. The pass-through chambers 922, 924 can be used, for example, to cryo cool the wafer before processing in the second section 930, or allow wafer cooling or post-processing before moving back to the first section 920.

A system controller 990 is in communication with the first robot 925, second robot 935, first plurality of processing chambers 902, 904, 916, 918 and second plurality of processing chambers 906, 908, 910, 912, 914. The system controller 990 can be any suitable component that can control the processing chambers and robots. For example, the system controller 990 can be a computer including a central processing unit (CPU) 992, memory 994, inputs/outputs (I/O) 996, and support circuits 998. The controller 990 may control the processing tool 900 directly, or via computers (or controllers) associated with particular process chamber and/or support system components.

In one or more embodiments, the controller 990 may be one of any form of general-purpose computer processor that can be used in an industrial setting for controlling various chambers and sub-processors. The memory 994 or computer readable medium of the controller 990 may be one or more of readily available memory such as non-transitory memory (e.g. random access memory (RAM)), read only memory (ROM), floppy disk, hard disk, optical storage media (e.g., compact disc or digital video disc), flash drive, or any other form of digital storage, local or remote. The memory 994 can retain an instruction set that is operable by the processor (CPU 992) to control parameters and components of the processing tool 900.

The support circuits 998 are coupled to the CPU 992 for supporting the processor in a conventional manner. These circuits include cache, power supplies, clock circuits, input/output circuitry and subsystems, and the like. One or more processes may be stored in the memory 994 as software routine that, when executed or invoked by the processor, causes the processor to control the operation of the processing tool 900 or individual processing units in the manner described herein. The software routine may also be stored and/or executed by a second CPU (not shown) that is remotely located from the hardware being controlled by the CPU 992.

Some or all of the processes and methods of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 990 has one or more configurations to execute individual processes or sub-processes to perform the method. The controller 990 can be connected to and configured to operate intermediate components to perform the functions of the methods. For example, the controller 990 can be connected to and configured to control a nitridation chamber.

Processes may generally be stored in the memory 994 of the system controller 990 as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the system controller 990 has a configuration to control a nitridation chamber to nitridate the metal M layers on a wafer at a temperature in the range of about 400° C. to about 1000° C. in an atmosphere of ammonia ($NH_3$) gas at ambient pressure.

In one or more embodiments, a processing tool comprises: a central transfer station comprising a robot configured to move a wafer; a plurality of process stations, each process station connected to the central transfer station and providing a processing region separated from processing regions of adjacent process stations, the plurality of process stations comprising a nitridation chamber and a wordline deposition chamber; and a controller connected to the central transfer station and the plurality of process stations, the controller configured to activate the robot to move the wafer between process stations, and to control a process occurring in each of the process stations.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of forming a memory device, the method comprising:
    forming an opening through a metal stack comprising alternating layers of a first material layer and a metal layer; and
    annealing the metal stack in an atmosphere of ammonia ($NH_3$) at a temperature in a range of from about 400° C. to about 1000° C. to selectively nitridate a portion of the metal layer through the opening to form a nitridated region adjacent the metal layer, wherein the nitridated region and the metal layer comprise the same metal.

2. The method of claim 1, wherein the metal stack is formed on one or more of a substrate, a semiconductor layer, and a sacrificial layer.

3. The method of claim 1, further comprising forming a bitline in the opening, wherein forming the bitline comprises:
    depositing a first oxide channel layer in the opening;
    depositing a nitride channel layer on the first oxide channel layer;
    depositing a second oxide channel layer on the nitride channel layer;
    forming a poly-silicon layer in the opening on the second oxide channel layer; and
    forming a bitline pad in the poly-silicon layer.

4. The method of claim 3, further comprising depositing an oxide layer on a top surface of the metal stack prior to forming the opening.

5. The method of claim 4, further comprising depositing an interlayer dielectric on a top surface of the oxide layer and the bitline pad.

6. The method of claim 1, wherein the nitridated region has a thickness in a range of from about 0.1 nm to about 10 nm.

7. The method of claim 1, wherein the nitridated region protrudes into the opening.

8. The method of claim 1, wherein the nitridated region is recessed from the opening.

9. The method of claim 1, wherein the metal layer comprises one or more of tungsten (W), molybdenum (Mo), tantalum (Ta), ruthenium (Ru), niobium (Nb), osmium (Os), zirconium (Zr), iridium (Ir), rhenium (Re), titanium (Ti), and the like.

10. The method of claim 1, wherein the first material layer comprises one or more of tungsten (W), molybdenum (Mo), tantalum (Ta), niobium (Nb), osmium (Os), zirconium (Zr), iridium (Ir), rhenium (Re), titanium (Ti), titanium nitride (TiN), tantalum nitride (TaN), tungsten nitride (WN), molybdenum nitride (MoN), zirconium nitride (ZrN), silicon oxide ($SiO_2$), ruthenium oxide ($RuO_x$), iridium oxide ($IrO_x$), tungsten oxide ($WO_x$), silicon nitride (SiN), and the like.

11. The method of claim 1, wherein the nitridated region comprises one or more of tungsten nitride (WN), molybdenum nitride (MoN), tantalum nitride (TaN), ruthenium nitride (RuN), niobium nitride (NbN), osmium nitride (OsN), zirconium nitride (ZrN), iridium nitride (IrN), rhenium nitride (ReN), titanium nitride (TiN), and the like.

12. The method of claim 1, further comprising wordline contacts comprising one or more of copper (Cu), cobalt (Co), tungsten (W), titanium (Ti), molybdenum (Mo), nickel (Ni), ruthenium (Ru), silver (Ag), gold (Au), iridium (Ir), tantalum (Ta), and platinum (Pt).

13. A semiconductor memory device comprising:
a metal stack comprising alternating first material layers and metal layers in a first portion of the semiconductor memory device, wherein the alternating first material layers and metal layers do not comprise the same material;
a memory stack in a second portion of the semiconductor memory device, the memory stack comprising:
alternating first material layers and wordlines, the wordlines comprising a metal layer with a metal nitridated region adjacent the metal layer, wherein the nitridated region and the metal layer comprise the same metal,
a plurality of bitlines extending through the memory stack; and
wordline contacts extending from a top surface of the wordlines.

14. The semiconductor memory device of claim 13, wherein the metal layers comprise one or more of tungsten (W), molybdenum (Mo), tantalum (Ta), ruthenium (Ru), niobium (Nb), osmium (Os), zirconium (Zr), iridium (Ir), rhenium (Re), titanium (Ti), and the metal nitridated region comprises one or more of tungsten nitride (WN), molybdenum nitride (MoN), tantalum nitride (TaN), ruthenium nitride (RuN), niobium nitride (NbN), osmium nitride (OsN), zirconium nitride (ZrN), iridium nitride (IrN), rhenium nitride (ReN), and titanium nitride (TiN).

15. The semiconductor memory device of claim 13, wherein the first material layers comprise one or more of tungsten (W), molybdenum (Mo), tantalum (Ta), niobium (Nb), osmium (Os), zirconium (Zr), iridium (Ir), rhenium (Re), titanium (Ti), titanium nitride (TiN), tantalum nitride (TaN), tungsten nitride (WN), molybdenum nitride (MoN), zirconium nitride (ZrN), silicon oxide ($SiO_2$), ruthenium oxide ($RuO_x$), iridium oxide ($IrO_x$), tungsten oxide ($WO_x$), silicon nitride (SiN), and the like.

16. The semiconductor memory device of claim 13, wherein the wordline contacts comprise one or more of copper (Cu), cobalt (Co), tungsten (W), titanium (Ti), molybdenum (Mo), nickel (Ni), ruthenium (Ru), silver (Ag), gold (Au), iridium (1r), tantalum (Ta), and platinum (Pt).

17. A processing tool comprising:
a central transfer station comprising a robot configured to move a wafer;
a plurality of process stations, each process station connected to the central transfer station and providing a processing region separated from processing regions of adjacent process stations, the plurality of process stations comprising an annealing chamber; and
a controller connected to the central transfer station and the plurality of process stations, the controller configured to activate the robot to move the wafer between process stations, and to control a process occurring in each of the process stations, and to nitridate a portion of the metal layers on the wafer at a temperature in a range of from about 400° C. to about 1000° C. in an atmosphere of ammonia ($NH_3$) gas at ambient pressure to form a nitridated region adjacent the metal layer, wherein the nitridated region and the metal layer comprise the same metal.

* * * * *

UNITED STATES PATENT AND TRADEMARK OFFICE
CERTIFICATE OF CORRECTION

| | | |
|---|---|---|
| PATENT NO. | : 11,587,796 B2 | Page 1 of 1 |
| APPLICATION NO. | : 17/147578 | |
| DATED | : February 21, 2023 | |
| INVENTOR(S) | : Chang Seok Kang et al. | |

It is certified that error appears in the above-identified patent and that said Letters Patent is hereby corrected as shown below:

On the Title Page

• Under "References Cited", in U.S. PATENT DOCUMENTS, Line 06, item (56) replace "Katsuki" after "11/2016" with "Liu; Qing".

Signed and Sealed this
Eighteenth Day of April, 2023

Katherine Kelly Vidal
*Director of the United States Patent and Trademark Office*